(12) United States Patent
Wu

(10) Patent No.: US 9,368,433 B2
(45) Date of Patent: Jun. 14, 2016

(54) METHOD AND APPARATUS FOR MOUNTING SOLDER BALLS TO AN EXPOSED PAD OR TERMINAL OF A SEMICONDUCTOR PACKAGE

(71) Applicant: Marvell World Trade Ltd., St. Michael (BB)

(72) Inventor: Albert Wu, Palo Alto, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/699,496

(22) Filed: Apr. 29, 2015

(65) Prior Publication Data

US 2015/0318232 A1 Nov. 5, 2015

Related U.S. Application Data

(60) Provisional application No. 61/986,678, filed on Apr. 30, 2014.

(51) Int. Cl.
*H01L 23/495* (2006.01)

(52) U.S. Cl.
CPC ...... *H01L 23/49558* (2013.01); *H01L 23/4952* (2013.01); *H01L 23/49513* (2013.01); *H01L 23/49568* (2013.01)

(58) Field of Classification Search
CPC ............ H01L 23/495; H01L 23/49603; H01L 23/49541; H01L 23/49513; H01L 23/49558; H01L 23/49503; H01L 23/4952; H01L 23/49805

USPC ......... 257/666-669, 670, 671-676, 677, 690, 257/693, E23.031-E23.059
See application file for complete search history.

(56) References Cited

U.S. PATENT DOCUMENTS

| | | | | |
|---|---|---|---|---|
| 7,679,172 | B2* | 3/2010 | Huang et al. | 257/678 |
| 8,258,609 | B2* | 9/2012 | Camacho et al. | 257/670 |
| 9,029,992 | B2* | 5/2015 | Kim et al. | 257/676 |
| 2008/0290487 | A1 | 11/2008 | Zhao et al. | |
| 2009/0243077 | A1* | 10/2009 | Chow et al. | 257/690 |
| 2011/0221049 | A1 | 9/2011 | Tang et al. | |

FOREIGN PATENT DOCUMENTS

JP 2003218284 A 7/2003

* cited by examiner

*Primary Examiner* — Jasmine Clark

(57) ABSTRACT

Embodiments of the present disclosure provide a package comprising a die attach pad, a die disposed on the die attach pad and a leadframe. The leadframe includes an opening defined therein that exposes a bottom surface of the die attach pad. The leadframe comprises a plurality of bond pads that are exposed at a bottom surface of the leadframe and a plurality of traces that are exposed at the bottom surface of the leadframe. Each trace of the plurality of traces is coupled to a corresponding bond pad of the plurality of bond pads. At least some of the traces are coupled to the die at top surfaces of the at least some of the traces. The leadframe also comprises a plurality of first insulated barriers. Each first insulated barrier is located between (i) a corresponding trace and (ii) a corresponding bond pad coupled to the corresponding trace.

21 Claims, 4 Drawing Sheets

METHOD AND APPARATUS FOR MOUNTING SOLDER BALLS TO AN EXPOSED PAD OR TERMINAL OF A SEMICONDUCTOR PACKAGE

CROSS REFERENCE TO RELATED APPLICATIONS

This disclosure claims priority to U.S. Provisional Patent Application No. 61/986,678, filed Apr. 30, 2014, the entire specification of which is hereby incorporated by reference in its entirety.

TECHNICAL FIELD

Embodiments of the present disclosure relate to semiconductor packages, and more particularly, to techniques for mounting solder balls to an exposed pad or terminal of a semiconductor package (e.g., a Quad Flat No-leads (QFN) semiconductor package).

BACKGROUND

Conventional Quad Flat No-leads (QFN) packages or exposed pad lead frame packages generally include an exposed die attach pad and terminals or bond pads on a bottom surface of the packages that may be utilized to mount such packages on a substrate such as a printed circuit board (PCB). Solder on the bond pads and/or exposed die attach pad is generally utilized to couple the packages to the PCB to thereby provide an electrical connection between the packages and the PCB in addition to providing a physical connection. However, when solder is utilized to attach the packages to the PCB, the solder may spread and thereby short the exposed areas on the bottom surface of the package.

SUMMARY

In various embodiments, the present disclosure provides a package comprising a die attach pad, a die disposed on the die attach pad and a leadframe. The leadframe includes an opening defined therein, wherein the opening exposes a bottom surface of the die attach pad. The leadframe comprises a plurality of bond pads, wherein bottom surfaces of the plurality of bond pads are exposed at a bottom surface of the leadframe. The leadframe further comprises a plurality of traces, wherein the plurality of traces is exposed at the bottom surface of the leadframe, wherein each trace of the plurality of traces is coupled to a corresponding bond pad of the plurality of bond pads, and wherein at least some of the traces are coupled to the die at top surfaces of the at least some of the traces. The leadframe also comprises a plurality of first insulated barriers, wherein each first insulated barrier of the plurality of first insulated barriers is located between (i) a corresponding trace and (ii) a corresponding bond pad coupled to the corresponding trace.

In various embodiments, the present disclosure also provides an apparatus that comprises a package comprising a die attach pad, a die disposed on the die attach pad and a leadframe. The leadframe includes an opening defined therein, wherein the opening exposes a bottom surface of the die attach pad. The leadframe comprises a plurality of bond pads, wherein bottom surfaces of the plurality of bond pads are exposed at a bottom surface of the leadframe. The leadframe further comprises a plurality of traces, wherein the plurality of traces is exposed at the bottom surface of the leadframe, wherein each trace of the plurality of traces is coupled to a corresponding bond pad of the plurality of bond pads, and wherein at least some of the traces are coupled to the die at top surfaces of the at least some of the traces. The leadframe also comprises a plurality of first insulated barriers, wherein each first insulated barrier of the plurality of first insulated barriers is located between (i) a corresponding trace and (ii) a corresponding bond pad coupled to the corresponding trace. The apparatus further comprises a substrate, wherein the package is coupled to the substrate via solder disposed on at least some of the plurality of bond pads.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Figure 1A:
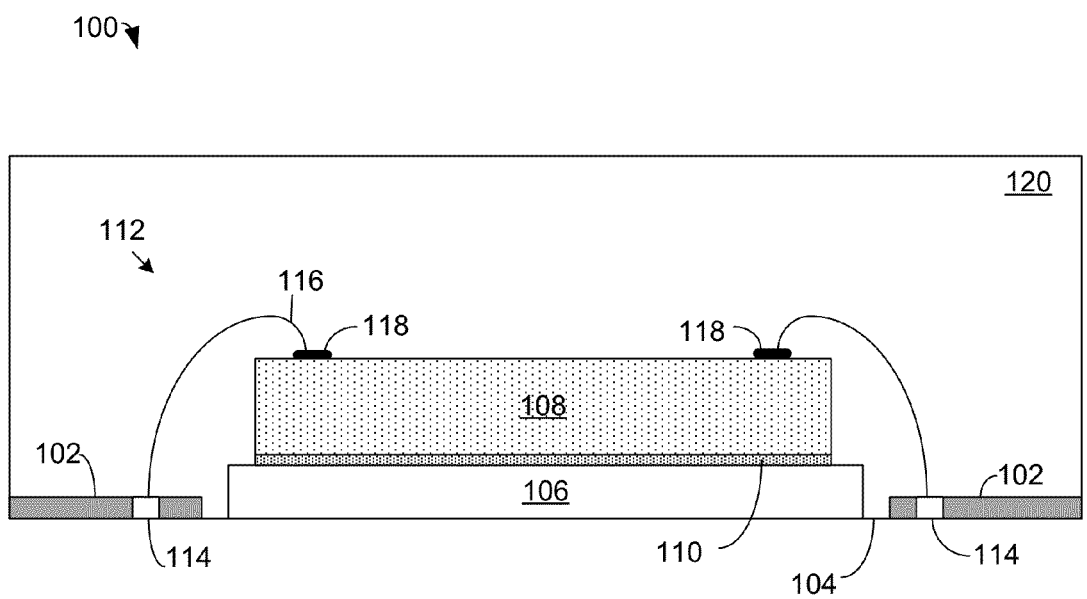
FIG. 1A is a side, cross-sectional schematic view of a package configured as a Quad Flat No-leads (QFN) package, in accordance with various embodiments.

FIG. 1A schematically illustrates a cross-sectional view of a package 100 configured as a Quad Flat No-leads (QFN) package. The package 100 includes a leadframe 102. The leadframe 102 includes an opening 104 defined therein. Within the opening 104, a die attach pad 106 is provided. In accordance with various embodiments, the die attach pad 106 is a thermal die attach pad that comprises thermally conductive metal or a combination of thermally conductive metals and/or other thermally conductive materials in order to help dissipate heat. A die 108 is disposed on the die attach pad 106. The die 108 is attached to the die attach pad 106 via an appropriate adhesive or epoxy 110 that may be thermally conductive. Wirebond connections 112 are utilized to couple the die 108 to top surfaces of the terminals or bond pads 114 of the leadframe 102 via wires 116. The wires 116 extend from bond pads 118 located on a top surface of the die 108 to the bond pads 114 located on the leadframe 102. A body or molding 120 substantially encapsulates the various components of the package 100 in order to protect the components. The molding 120 generally comprises some type of protective material such as, for example, plastic. As can be seen in FIG. 1A, the die attach pad 106 is arranged within the opening 104 such that a bottom surface of the die attach pad 106 is exposed and is substantially flush with a bottom surface of the leadframe 102. In embodiments, the molding 120 supports the die attach pad 106 and the die 108 within the package 100. In other embodiments, the leadframe 102 includes a lip (not illustrated) that supports the die attach pad 106.

Figure 1B:
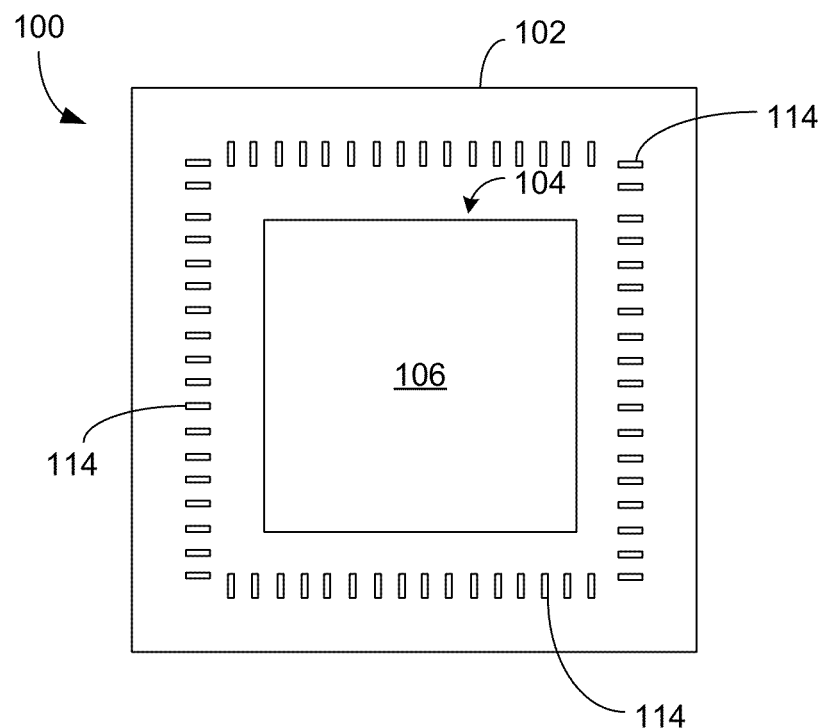
FIG. 1B is a schematic bottom view of the packaging arrangement illustrated in FIG. 1A, in accordance with various embodiments.

FIG. 1B schematically illustrates a bottom view of the package 100 of FIG. 1A. As can be seen, the die attach pad 106 is exposed within the opening 104 of the leadframe 102. Additionally, bottom surfaces of the bond pads or terminals 114 are exposed around a periphery of the leadframe 102. In accordance with embodiments, the package 100 is configured as a dual row QFN package and therefore, includes two rows of bond pads or terminals 114 around the periphery of the leadframe 102. In accordance with various embodiments, the die attach pad 106 substantially "fills" the opening 104 within the leadframe 102.

Figure 1C:
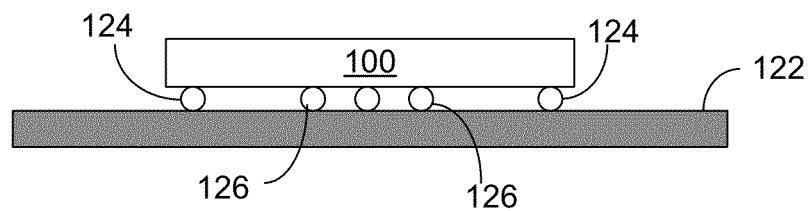
FIG. 1C is a side, cross-sectional schematic view of the packaging arrangement of FIGS. 1A and 1B coupled to a substrate, in accordance with various embodiments.

The bond pads 114 are exposed through the bottom surface of the leadframe 102 in order to provide electrical connections to a substrate 122 such as, for example, a printed circuit board (PCB), another package, etc. FIG. 1C illustrates a side view of the package 100 coupled to the substrate 122. As can be seen, the package 100 is coupled to the substrate 122 via a plurality of solder balls 124 on the bond pads 114 around the periphery of the leadframe 102, as well as a plurality of solder balls 126 on the exposed surface of the die attach pad 106. In embodiments where the die attach pad 106 is a thermal die attach pad, the coupling of the die attach pad 106 to the substrate 122 can help dissipate heat from the die 108 through the thermal die attach pad 106 and through the solder 126 to the substrate 122. The exposed bottom surface of the die attach pad 106 to the substrate 122 can also serve as a ground connection.

Figure 2A:
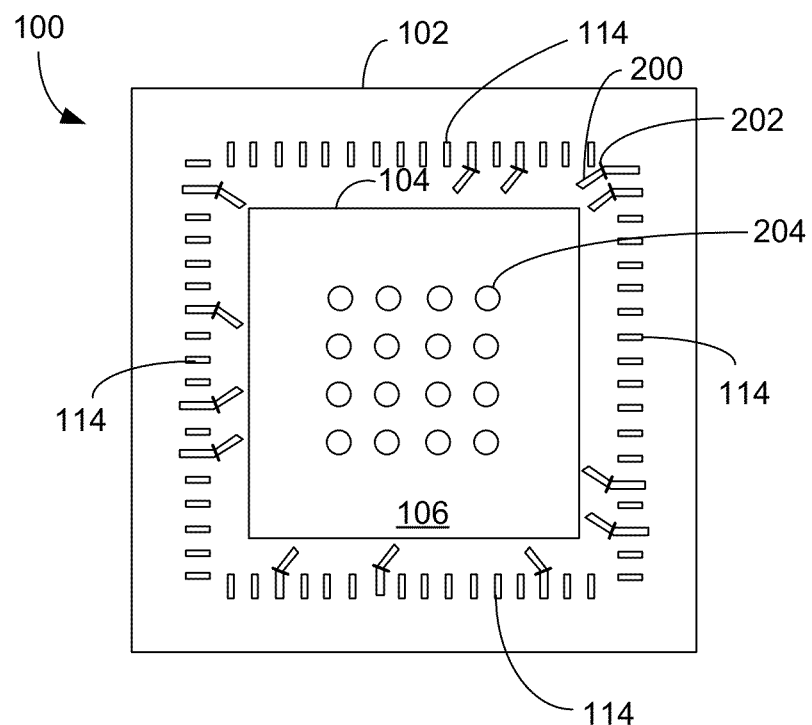
FIGS. 2A-2D are schematic views of the packaging arrangement of FIGS. 1A and 1B including insulated barriers, in accordance with various embodiments.

The wires 116 of the wire bond connections 112 provide inductance and it is generally desirable to minimize the inductance of the wires 116. Thus, referring to FIG. 2A, traces 200 are provided that extend from the bond pads 114 towards the die attach pad 106 and thereby, the die 108. Thus, the wires 116 of the wire bond connections 112 are coupled to ends of the traces 200, which allows for the wires 116 of the wire bond connections 114 to be shorter, thereby reducing the inductance of the wires 116. As can be seen in FIG. 2A, the traces 200 extending from the bond pads 114 are also exposed in the bottom surface of the leadframe 102. Thus, when solder is placed on the bond pads and the package 100 is coupled to a substrate (such as substrate 122), the solder can run or spread when the solder is reheated in order to attach the package 100 to the substrate. Such spreading of the solder can cause the solder to spread and contact adjacent traces 200, thereby shorting the affected traces 200. Additionally, solder utilized to couple the exposed die attach pad 106 to the substrate can also run or spread when heated. However, if the solder spreads to any of the traces 200, then once again the affected traces 200 can be shorted.

Figure 2B:
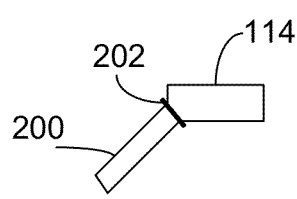
Figure 2C:
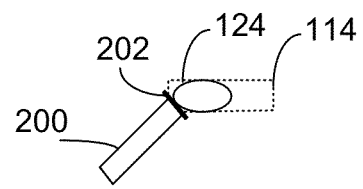

In accordance with various embodiments, and referring to FIG. 2B, an insulated barrier 202 is provided between the bond pads 114 and the traces 200 on the bottom surface of the leadframe 102. The insulated barriers 202 can be any type of insulating material and, in accordance with various embodiments, comprises solder mask. The solder mask can be deposited between the bond pads 114 and the traces 202 utilizing, for example, a suitable type of printing method such as, for example, screen printing, stencil printing, or ink jet printing. Other known methods of depositing solder mask may be used if desired. Thus, when solder is placed on the bottom surfaces of the bond pads 114 and heated or reflowed in order to couple the package 100 to a substrate, as can be seen in FIG. 2C the solder does not run or spread past the insulated barriers 202. Thus, the use of solder balls 124 will not provide a solder wetting problem among the traces 202 as the solder will not spread among the traces 202. Thus, shorting of the traces 202 may be minimized or even prevented.

Figure 2D:
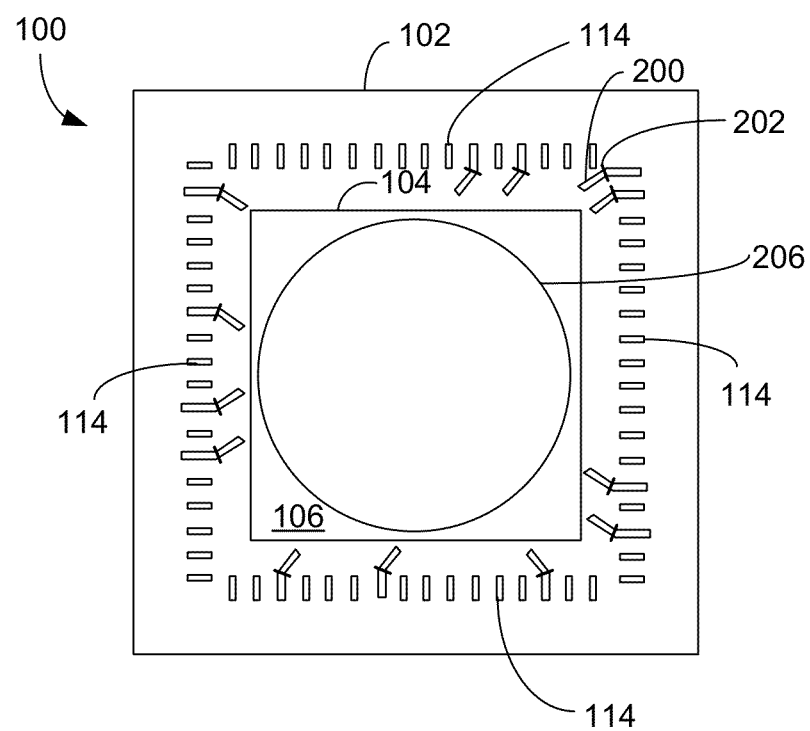

As can be further seen in FIG. 2A, in accordance with various embodiments, a plurality of insulated barriers 204 may be provided on the exposed bottom surface of the die attach pad 106. For example, a plurality of circular insulated barriers 204 may be provided in which solder balls 126 may be disposed. In accordance with various embodiments, and as can be seen in FIG. 2D, a single insulated barrier 206 may be provided around the periphery of the exposed bottom surface of the die attach pad 106 in which solder balls 126 may be disposed. When the package 100 is coupled to a substrate, such as substrate 122, and the solder balls 126 are heated and reflowed, the solder will not spread beyond the insulated barriers 204.

While FIGS. 2A and 2D illustrate the insulated barriers 204 and 206 as having a circular shape, other shapes such as, for example, a square shape (corresponding to the shape of the die attach pad 106 for insulated barrier 206) can be used if desired. Once again, the insulated barriers 204, 206 generally comprise a suitable type of insulating material and in accordance with various embodiments, comprises a solder mask.

Accordingly, in accordance with various embodiments, by providing insulated barriers 202 between the bond pads 114 and the traces 200, as well as an insulated barrier or barriers 204, 206 on the exposed surface of the die attach pad 106, the package 100 configured as a QFN package may be mounted to a substrate 122 in a manner similar to a ball grid array (BGA) package. Thus, the package 100 can be flip chip attached to the substrate 122, if desired. Because of the insulated barriers 202, 204 and/or 206, the solder will generally, during reheating of the solder balls 124 and/or 126, not spread from the bond pads 114 between the traces 200 or from the exposed bottom surface of the die attach pad 106 to the traces 200. Thus, shorting of the traces 200 may be minimized or even prevented. Additionally, the addition of the traces 200 in the package 100 allow for the use of shorter wires 116 in the wire bond connections 112 between the die 108 and the leadframe 102, thereby reducing inductance of the wires 116.

The description may use perspective-based descriptions such as up/down, over/under, and/or, or top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order-dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

The terms chip, die, semiconductor die, integrated circuit, integrated circuit die, monolithic device, semiconductor device, and microelectronic device are often used interchangeably in the microelectronics field. The present invention is applicable to all of the above as they are generally understood in the field.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. A package comprising:
   a die attach pad;
   a die disposed on the die attach pad; and
   a leadframe, wherein the leadframe includes an opening defined therein, wherein the opening exposes a bottom surface of the die attach pad, and wherein the leadframe comprises
      a plurality of bond pads, wherein bottom surfaces of the plurality of bond pads are exposed at a bottom surface of the leadframe,
      a plurality of traces, wherein the plurality of traces is exposed at the bottom surface of the leadframe, wherein each trace of the plurality of traces is coupled to a corresponding bond pad of the plurality of bond pads, and wherein at least some of the traces are coupled to the die at top surfaces of the at least some of the traces, and
      a plurality of first insulated barriers, wherein each first insulated barrier of the plurality of first insulated barriers is located between (i) a corresponding trace and (ii) a corresponding bond pad coupled to the corresponding trace.

2. The package of claim 1, wherein the package comprises one of (i) a quad flat no-leads package or (ii) a dual row quad flat no-leads package.

3. The package of claim 1, wherein the package further comprises a second insulated barrier disposed on the bottom surface of the die attach pad.

4. The package of claim 1, further comprising solder disposed on the bottom surface of die attach pad, wherein the solder is disposed on the bottom surface of the die attach pad such that the plurality of second insulated barriers are between the solder and the plurality of traces.

5. The package of claim 4, wherein the plurality of second insulated barriers comprises solder mask.

6. The package of claim 1, wherein the plurality of first insulated barriers comprises solder mask.

7. The package of claim 1, further comprising solder disposed on the bottom surfaces of at least some of the plurality of bond pads.

8. The package of claim 1, wherein the at least some of the traces are coupled to the die via a wirebond connection.

9. The package of claim 1, wherein the die attach pad comprises a thermal die attach pad.

10. An apparatus comprising:
    a package comprising
       a die attach pad,
       a die disposed on the die attach pad, and
       a leadframe, wherein the leadframe includes an opening defined therein, wherein the opening exposes a bottom surface of the die attach pad, and wherein the leadframe comprises
          a plurality of bond pads, wherein bottom surfaces of the plurality of bond pads are exposed at a bottom surface of the leadframe,
          a plurality of traces, wherein the plurality of traces is exposed at the bottom surface of the leadframe, wherein each trace of the plurality of traces is coupled to a corresponding bond pad of the plurality of bond pads, and wherein at least some of the traces are coupled to the die at top surfaces of the at least some of traces, and
          a plurality of first insulated barriers, wherein each first insulated barrier of the plurality of first insulated barriers is located between (i) a corresponding trace and (ii) a corresponding bond pad coupled to the corresponding trace; and
    a substrate, wherein the package is coupled to the substrate via solder disposed on at least some of the plurality of bond pads.

11. The apparatus of claim 10, wherein the package comprises one of (i) a quad flat no-leads package or (ii) a dual row quad flat no-leads package.

12. The apparatus of claim 10, wherein the package further comprises a second insulated barrier disposed on the bottom surface of the die attach pad.

13. The apparatus of claim 10, further comprising solder disposed on the bottom surface of die attach pad, wherein the solder is disposed on the bottom surface of the die attach pad such that the plurality of second insulated barriers are between the solder and the plurality of traces.

14. The apparatus of claim 10, wherein the plurality of first insulated barriers comprises solder mask.

15. The apparatus of claim 10, wherein the at least some of the traces are coupled to the die via a wirebond connection.

16. The apparatus of claim 10, wherein the substrate comprises a printed circuit board.

17. A package comprising:
    a die attach pad;
    a die disposed on the die attach pad; and
    a leadframe, wherein the leadframe comprises
       a plurality of bond pads,
       a plurality of traces, wherein a first trace of the plurality of traces is coupled to a first bond pad of the plurality of bond pads, and wherein the first trace of the plurality of traces is coupled to the die, and
       a first insulated barrier, wherein the first insulated barrier is located between (i) the first trace of the plurality of traces and (ii) the first bond pad of the plurality of bond pads.

18. The package of claim 17, wherein the package further comprises a second insulated barrier disposed on a bottom surface of the die attach pad.

19. The package of claim 17, wherein the first trace of the plurality of traces is coupled to the die via a wirebond connection.

20. The package of claim 17, wherein:
    the first trace of the plurality of traces has (i) a top surface and (ii) a bottom surface that is opposite to the top surface of the first trace of the plurality of traces;
    the first bond pad of the plurality of bond pads has (i) a top surface and (ii) a bottom surface that is opposite to the top surface of the first bond pad of the plurality of bond pads;
    the first insulated barrier is located between (i) the bottom surface of the first trace of the plurality of traces and (ii) the bottom surface of the first bond pad of the plurality of bond pads; and
    the top surface of the first trace of the plurality of traces is coupled to the die via a wirebond connection.

21. The package of claim 17, wherein:
the leadframe includes an opening defined therein; and
the opening exposes a bottom surface of the die attach pad.

* * * * *